United States Patent
Long et al.

(10) Patent No.: US 7,238,389 B2
(45) Date of Patent: Jul. 3, 2007

(54) VAPORIZING FLUIDIZED ORGANIC MATERIALS

(75) Inventors: Michael Long, Hilton, NY (US); David R. Strip, Albuquerque, NM (US); Jeremy M. Grace, Penfield, NY (US); Dennis R. Freeman, Spencerport, NY (US); Neil P. Redden, Sodus Point, NY (US); Bruce E. Koppe, Caledonia, NY (US)

(73) Assignee: Eastman Kodak Company, Rochester, NY (US)

( * ) Notice: Subject to any disclaimer, the term of this patent is extended or adjusted under 35 U.S.C. 154(b) by 486 days.

(21) Appl. No.: 10/805,980

(22) Filed: Mar. 22, 2004

(65) Prior Publication Data

US 2005/0208220 A1    Sep. 22, 2005

(51) Int. Cl.
    *C23C 16/00*    (2006.01)
(52) U.S. Cl. ................. 427/248.1; 427/901; 427/255.6
(58) Field of Classification Search ............. 427/248.1, 427/225.6, 901; 118/726
    See application file for complete search history.

(56) References Cited

U.S. PATENT DOCUMENTS 2,447,789 A    8/1948  Barr
4,734,451 A *  3/1988  Smith .......................... 524/493
4,769,292 A    9/1988  Tang et al.
4,885,211 A    12/1989 Tang et al.
5,835,678 A *  11/1998 Li et al. ...................... 392/401
6,291,031 B1 * 9/2001  Okazaki et al. ............. 427/593
2003/0192471 A1 10/2003 Jurgensen et al.

FOREIGN PATENT DOCUMENTS

EP    0982411    3/2000

OTHER PUBLICATIONS

Patent Abstracts of Japan vol. 2002, No. 5, May 3, 2002 & JP 2002 030419 A (Canon) Jan. 31, 2002.

* cited by examiner

*Primary Examiner*—Timothy Meeks
*Assistant Examiner*—Kelly M. Stouffer
(74) *Attorney, Agent, or Firm*—Raymond L. Owens

(57) ABSTRACT

A method for vaporizing organic materials onto a surface, to form a film includes providing a quantity of organic material in a fluidized powdered form; metering the powdered organic material and directing a stream of such fluidized powder onto a first member; heating the first member so that as the stream of fluidized powder is vaporized; collecting the vaporized organic material in a manifold; and providing a second member formed with at least one aperture in communication with the manifold that permits the vaporized organic material to be directed onto the surface to form a film.

**

VAPORIZING FLUIDIZED ORGANIC MATERIALS

CROSS REFERENCE TO RELATED APPLICATIONS

Figure 1:
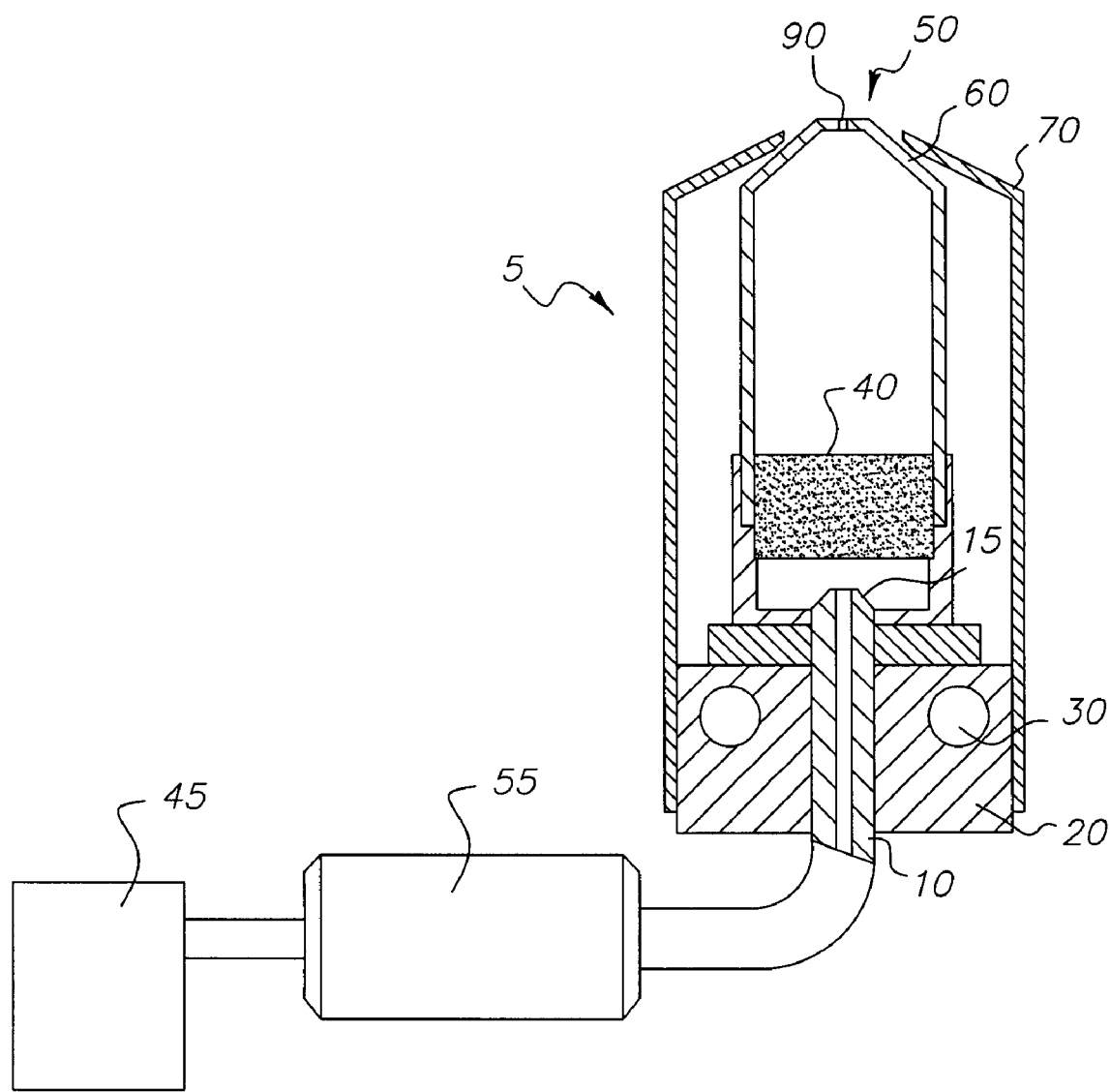
Figure 2:
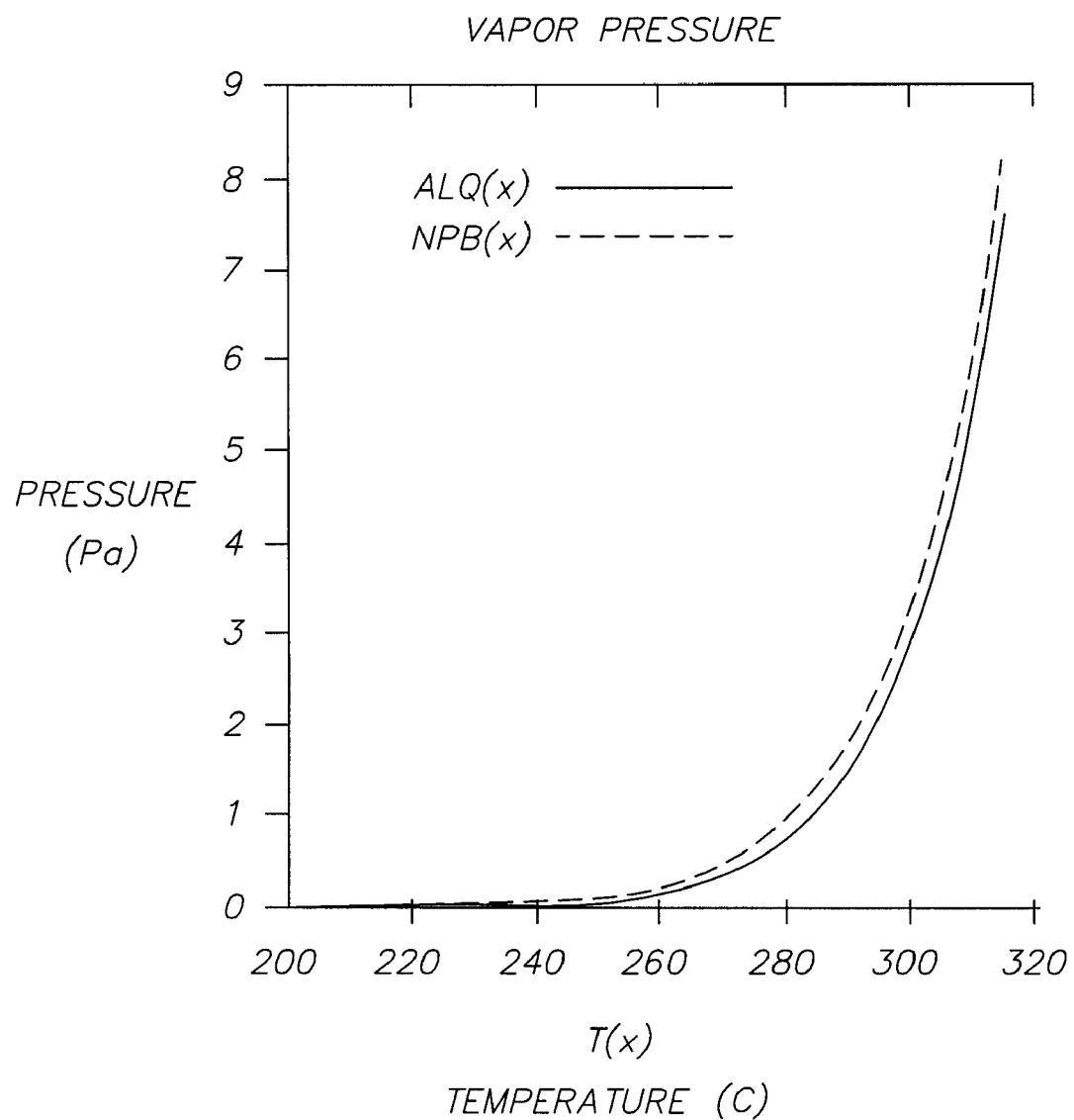

Reference is made to commonly assigned U.S. patent application Ser. No. 10/352,558 filed Jan. 28, 2003 by Jeremy M. Grace et al., entitled "Method of Designing a Thermal Physical Vapor Deposition System", U.S. patent application Ser. No. 10/784,585 filed Feb. 23, 2004, by Michael Long et al, entitled "Device and Method for Vaporizing Temperature Sensitive Materials", U.S. patent application Ser. No. 10/805,847 filed concurrently herewith, by Michael Long et al, entitled "High Thickness Uniformity Vaporization Source", the disclosures of which are herein incorporated by reference.

FIELD OF THE INVENTION

The present invention relates to the field of physical vapor deposition where a source material is heated to a temperature so as to cause vaporization and create a vapor plume to form a thin film on a surface of a substrate.

BACKGROUND OF THE INVENTION

An organic light emitting diode (OLED) device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. The low deposition rate and frequent source recharging place substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials. These multiple sources must be maintained in an angled arrangement so that the evaporated materials from each source converge at a common point on an OLED substrate. This use of multiple spaced-apart sources leads to obvious limitations in the number of materials that can be co-deposited and obvious deficiencies in the homogeneity of the host and dopant films.

The organic materials used in OLED devices have a highly non-linear vaporization-rate dependence on source temperature. A small change in source temperature leads to a very large change in vaporization rate. Despite this, prior art devices employ source temperature as the only means to control vaporization rate. To achieve good temperature control, prior art deposition sources typically utilize heating structures whose solid volume is much larger than the organic charge volume, composed of high thermal-conductivity materials that are well insulated. The high thermal conductivity insures good temperature uniformity through the structure and the large thermal mass helps to maintain the temperature within a critically small range by reducing temperature fluctuations. These measures have the desired effect on steady-state vaporization rate stability but have a detrimental effect at start-up. It is common that these devices must operate for many hours at start-up before steady state thermal equilibrium and hence a steady vaporization rate is achieved.

A further limitation of prior art sources is that the geometry of the vapor manifold changes as the organic material charge is consumed. This change requires that the heater temperature change to maintain a constant vaporization rate and it is observed that the plume shape of the vapor exiting the orifices changes as a function of the organic material thickness and distribution in the source.

SUMMARY OF THE INVENTION

It is therefore an object of the present invention to provide a device and method for vaporizing organic materials while limiting their exposure to temperatures that can cause material degradation.

It is a further object of this invention to allow a single source to deposit two or more organic material components.

It is a further object of this invention to achieve a steady vaporization rate quickly.

It is a further object to maintain a steady vaporization rate with a large charge of organic material and with a steady heater temperature.

It is a further object of this invention to rapidly halt and rapidly reinitiate vaporization in the source to maximize the utilization of the organic material.

These objects are achieved by a method for vaporizing organic materials onto a surface, to form a film comprising:

(a) providing a quantity of organic material in a fluidized powdered form;

(b) metering the powdered organic material and directing a stream of such fluidized powder onto a first member;

(c) heating the first member so that as the stream of fluidized powder is vaporized;

(d) collecting the vaporized organic material in a manifold; and (e) providing a second member formed with at least one aperture in communication with the manifold that permits the vaporized organic material to be directed onto the surface to form a film.

It is an advantage of the present invention is that the device overcomes the heating and volume limitations of prior art devices in that only a small portion of organic material as a fluidized powder or an aerosol suspended in an inert carrier gas is heated to the desired rate-dependant vaporization temperature at a rapid rate, so that the organic material changes very rapidly from the solid to the vapor state and is said to undergo flash vaporization. It is therefore a feature of the present invention to maintain a steady vaporization rate and a steady heater temperature. The device thus allows extended operation of the source with substantially reduced risk of degrading even very temperature-sensitive organic materials. Flash vaporization additionally permits materials having different vaporization rates and degradation temperature thresholds to be co-vaporized without the need for multiple, angled sources as in the prior art.

It is a further advantage of the present invention that it permits finer rate control and additionally offers an independent measure of the vaporization rate.

It is a further advantage of the present invention that it can be cooled and reheated in a matter of seconds to stop and reinitiate vaporization and achieve a steady vaporization rate quickly. This feature minimizes contamination of the deposition chamber walls and conserves the organic materials when a substrate is not being coated.

It is a further advantage that the present device achieves substantially higher vaporization rates than in prior art devices without material degradation. Further still, no heater temperature change is required as the source material is consumed.

It is a further advantage of the present invention that it can provide a vapor source in any orientation, which is not possible with prior-art devices.

BRIEF DESCRIPTION OF THE DRAWINGS

FIG. 1 is a cross-sectional view of one embodiment of a device according to the present invention including a means for metering powdered organic material and directing a stream of fluidized powder into a heating region;

FIG. 2 shows a graphical representation of vapor pressure vs. temperature for two organic materials;

FIG. 3 is a cross-sectional view of a device according to the present invention including a deposition chamber enclosing a substrate; and FIG. 4 is a cross-sectional view of an OLED device structure that can be prepared with the present invention.

DETAILED DESCRIPTION OF THE INVENTION

Turning now to FIG. 1, there is shown a cross sectional view of one embodiment of a device of this disclosure. Vaporization apparatus 5 is a device for vaporizing organic materials onto a substrate surface to form a film and includes a permeable first member 40, a manifold 60, and a metering means, by which we mean a means for fluidizing powdered organic material or providing organic material in a fluidized powdered form, metering the powdered organic material and directing a stream of such fluidized powder onto permeable first member 40. Permeable first member 40 can be part of manifold 60. Manifold 60 also includes one or more apertures 90. Vaporization apparatus 5 also includes one or more shields 70.

In one embodiment, container 45 is a container for receiving a quantity of organic material in powdered form. Metering valve 55 in this embodiment includes a means for fluidizing the organic material and metering the fluidized powdered organic material at a controlled rate that varies linearly with vaporization rate. Organic material inlet 10 with nozzle 15 is a means for directing a stream of the fluidized powdered organic material onto permeable first member 40. Well-known means of fluidizing a powder include vibrational means, imparting a charge to the particles, and partially suspending the particles in a fluid medium.

In another embodiment, container 45 is a container for holding a charge of organic material suspended as an aerosol in an inert carrier gas. Metering valve 55 in this embodiment includes a means for metering an aerosol of fluidized powdered organic material at a controlled rate that varies linearly with vaporization rate.

In another embodiment, container 45 holds a solution of organic material dissolved in a supercritical solvent, such as supercritical $CO_2$. Evaporation or rapid expansion of the solution of organic material in the supercritical solvent is a means for providing organic material in a fluidized powdered form. This process has been described in detail by Grace et al. in above-cited U.S. patent application Ser. No. 10/352,558. Metering valve 55 includes a means for metering the thus-generated fluidized powdered organic material at a controlled rate that varies linearly with vaporization rate.

The organic material can include a single component, or can include two or more organic components, each one having a different vaporization temperature. The vaporization temperature can be determined by various means. For example, FIG. 2 shows a graphical representation of vapor pressure versus temperature for two organic materials commonly used in OLED devices. The vaporization rate is proportional to the vapor pressure, so for a desired vaporization rate, the data in FIG. 2 can be used to define the required heating temperature corresponding to the desired vaporization rate.

Fluidized powdered organic material is metered at a controlled rate by metering valve 55. Organic material inlet 10 including nozzle 15 includes a means for directing the stream of fluidized powdered organic material onto permeable first member 40. Nozzle 15 can be a heated nozzle. The outer surface of nozzle 15 is preferentially maintained at a temperature above the condensation temperature of the vapor so as to avoid accumulating condensed organic material on its surface, which can clog the nozzle orifice. The interior of the nozzle should be maintained at a temperature below the vaporization or melting point of the powdered organic material to similarly avoid clogging, especially with materials that liquefy before vaporizing. This requirement suggests the use of a nozzle construction having separate elements for the interior and exterior surfaces.

Permeable first member 40 is heated at a constant temperature and can take the form of open cell refractory foam. Various refractory metal and ceramic foams having an open cell structure of this type are available from e.g. ULTRAMET. These foams have over 90% open area and are commercially used as gas diffusers. Means for heating permeable first member 40 include induction or RF coupling, a radiant heating element in close proximity, or resistance heating means. Permeable first member 40 is controllably heated at a constant temperature sufficient to vaporize the organic material at the desired rate, which is a temperature above the vaporization temperature of the organic material, or each of the organic components thereof. Because a given organic component vaporizes at different rates over a continuum of temperatures, there is a logarithmic dependence of vaporization rate on temperature. In choosing a desired deposition rate, one also determines a necessary vaporization temperature of the organic material, which will be referred to as the desired rate-dependent vaporization temperature. In the case where the organic material includes two or more organic components, the temperature of permeable first member 40 is chosen to be above the vaporization temperature of each of the components so that each of the organic material components simultaneously vaporizes. The vaporized organic material vapors rapidly pass through permeable first member 40 and can enter into a volume of heated gas manifold 60 or pass directly on to the target substrate. Their residence time at the desired vaporization temperature is very short and as a result, there is little or no thermal degradation. The residence time of organic material at elevated temperature, that is, at the rate-dependent vaporization temperature, is orders of magnitude less than prior art devices and methods (seconds vs. hours or days in the prior art), which permits heating organic material to higher temperatures than in the prior art. Thus, the current device and method can achieve substantially higher vaporization rates, without causing appreciable degradation of organic material. The constant vaporization rate establishes and maintains a constant plume shape. The plume is herein defined as the vapor cloud exiting vaporization device 5. The organic material aerosol is shown impinging the lower surface of permeable first member 40, vaporizing, and the vapor passing through permeable first member 40 to enter the heated gas manifold 60. The invention can also be practiced where the aerosol impinges the manifold side of the permeable first member 40. In this case, the vapor is created directly in the heated gas manifold and does not pass through permeable first member 40. In such a case, permeable first member 40 is preferably not porous through its entire thickness, but retains the high specific surface area characteristics of a porous media at least on the surface where the aerosol impinges.

Manifold 60 is in communication with vaporized organic material that exits permeable first member 40. Thus, vaporized organic material is collected in manifold 60. A pressure develops as vaporization continues and streams of vapor exit the manifold 60 through the series of apertures 90 in second member 50. Second member 50 can be an integral part of manifold 60, as shown here, or can be a separate but attached unit. Apertures 90 are in communication with manifold 60 such that vaporized organic material collected by manifold 60 can be directed through apertures 90 onto a surface such as that of an OLED substrate. Manifold 60 and second member 50 can be heated at a constant temperature by heating means such as that described above for permeable first member 40. The conductance along the length of the manifold is designed to be roughly two orders of magnitude larger than the sum of the aperture conductances as described by Grace et al. in above-cited U.S. patent application Ser. No. 10/352,558. This conductance ratio promotes good pressure uniformity within manifold 60 and thereby minimizes flow non-uniformities through apertures 90 distributed along the length of the source despite potential local non-uniformities in vaporization rate.

One or more heat shields 70 are located adjacent the heated manifold 60 for the purpose of reducing the heat radiated to the facing target substrate. Heat shields 70 are thermally connected to base block 20 for the purpose of drawing heat away from the shields 70. Control passages 30 through this base block 20 allow the flow of a temperature control fluid, that is, a fluid adapted to either absorb heat from or deliver heat to base block 20 and thus provide a means of moderating the temperature of heat shields 70 by varying the temperature of the fluid in control passage 30. The fluid can be a gas or a liquid or a mixed phase. Vaporization apparatus 5 includes a means for pumping fluid through control passages 30. Such pumping means, not shown, are well-known to those skilled in the art. The upper portion of heat shields 70 is designed to lie below the plane of the apertures for the purpose of minimizing vapor condensation on their relatively cool surfaces.

Because only a small portion of organic material—that resident in permeable first member 40—is heated to the rate-dependent vaporization temperature, while the bulk of the material is kept well below the vaporization temperature, it is possible to interrupt the vaporization by a means for interrupting heating in permeable first member 40, e.g. stopping the flow of fluidized powdered organic material through metering valve 55 and therefore through permeable first member 40. This can be done when a substrate surface is not being coated so as to conserve organic material and minimize contamination of any associated apparatus, such as the walls of a deposition chamber, which will be described below.

Because permeable first member 40 prevents powdered organic material from passing freely through it, vaporization apparatus 5 can be used in any orientation. For example, vaporization apparatus 5 can be oriented 180° from what is shown in FIG. 1 so as to coat a substrate placed below it. This is an advantage not found in the heating boats of the prior art.

In practice, vaporization apparatus 5 can be used as follows. A quantity of powdered organic material, which can include one or more components, is provided into container 45 of vaporization apparatus 5. Permeable first member 40 is heated to a temperature above the vaporization temperature of the organic material or each of the components thereof and is maintained at a constant temperature as organic material is consumed. Powdered organic material is fluidized and metered at a controlled rate by metering valve 55 to organic material inlet 10 and consequently to nozzle 15, which directs the stream of fluidized powder onto permeable first member 40. As the stream of fluidized powdered organic material passes through permeable first member 40, it is heated at a desired rate-dependent vaporization temperature and vaporizes. When the organic material includes multiple components, each component simultaneously vaporizes. The vaporized organic material is collected in manifold 60, whereupon it passes through apertures 90 in provided second member 50, which direct the vaporized organic material onto a substrate surface to form a film. If second member 50 is heated, it is heated at a constant temperature as the organic material is consumed.

Alternatively, vaporization apparatus 5 can be used as follows. A supercritical $CO_2$ solution of organic material, which can include one or more components, is provided into container 45 of vaporization apparatus 5. Permeable first member 40 is heated to a temperature above the vaporization temperature of the organic material or each of the components thereof. Evaporation of the supercritical $CO_2$ solution provides organic material in a fluidized powdered form, which is metered at a controlled rate by metering valve 55 to organic material inlet 10 and consequently to nozzle 15, which directs the stream of fluidized powder onto permeable first member 40. As the stream of fluidized powdered organic material passes through permeable first member 40, it is heated at a desired rate-dependent vaporization temperature and vaporizes. When the organic material includes multiple components, each component simultaneously vaporizes. The vaporized organic material is collected in manifold 60, whereupon the vapor leaves apertures 90, and is directed onto a substrate surface to form a film.

Figure 3:
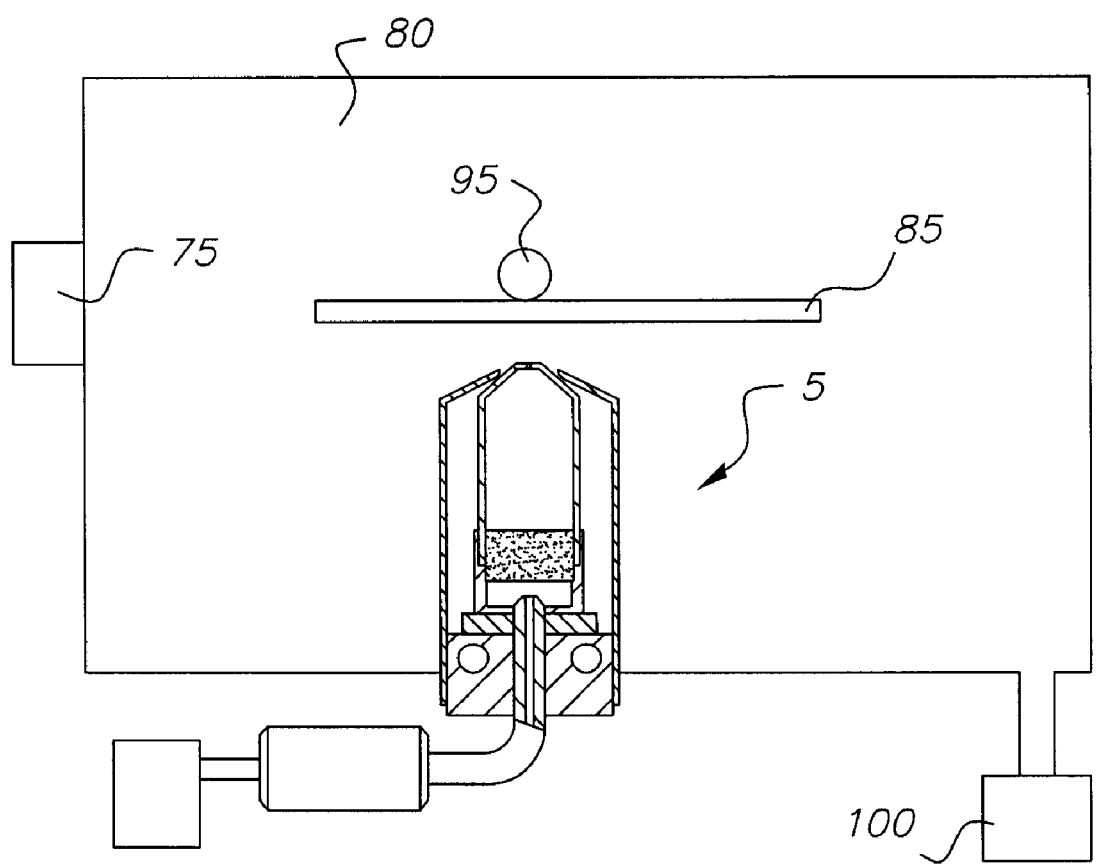

Turning now to FIG. 3, there is shown an embodiment of a device of this disclosure providing a deposition chamber enclosing a substrate. Deposition chamber 80 is an enclosed apparatus that permits an OLED substrate 85 to be coated with a film of organic material transferred from vaporization apparatus 5. Deposition chamber 80 is held under controlled conditions, e.g. a pressure of 1 torr or less provided by vacuum source 100. Deposition chamber 80 includes load lock 75 which can be used to load uncoated OLED substrates 85, and unload coated OLED substrates. OLED substrate 85 can be moved by translational apparatus 95 to provide even coating of vaporized organic material 10 over the entire surface of OLED substrate 85. Although vaporization apparatus 5 is shown as partially enclosed by deposition chamber 80, it will be understood that other arrangements are possible, including arrangements wherein vaporization apparatus 5 is entirely enclosed by deposition chamber 80.

In practice, an OLED substrate 85 is placed in deposition chamber 80 via load lock 75 and held by translational apparatus 95 or associated apparatus. Vaporization apparatus 5 is operated as described above, and translational apparatus 95 moves OLED substrate 85 perpendicular to the direction of emission of organic material vapors from vaporization apparatus 5, thus forming a film of organic material on the surface of OLED substrate 85.

Figure 4:
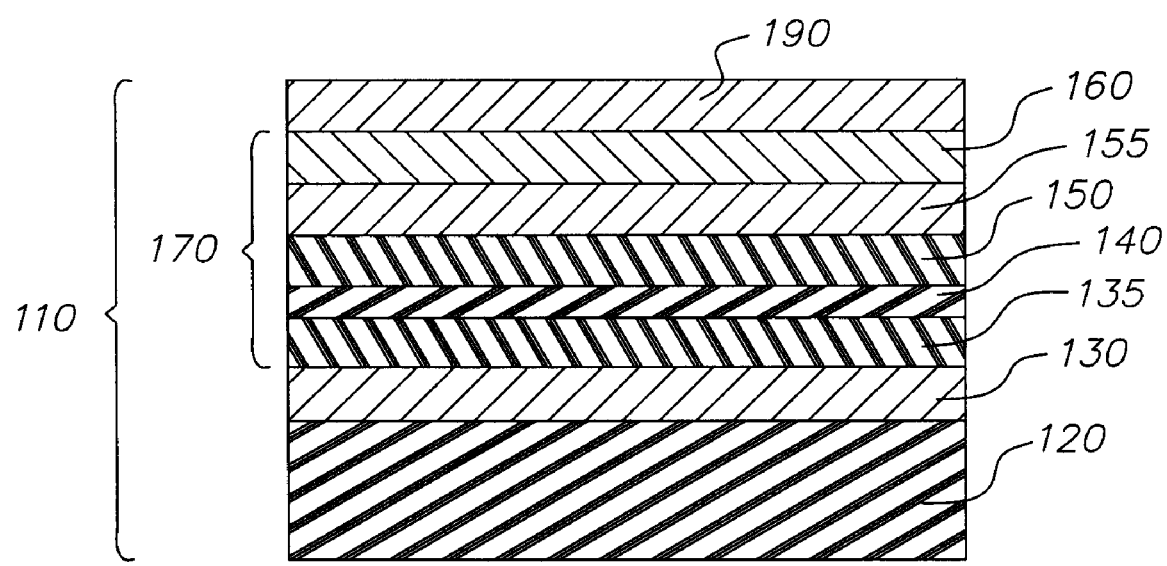

Turning now to FIG. 4, there is shown a cross-sectional view of a pixel of a light-emitting OLED device 110 that can be prepared in part according to the present invention. The OLED device 110 includes at a minimum a substrate 120, an cathode 190, an anode 130 spaced from cathode 190, and a light-emitting layer 150. The OLED device 110 can also include a hole-injecting layer 135, a hole-transporting layer 140, an electron-transporting layer 155, and an electron-injecting layer 160. Hole-injecting layer 135, hole-transporting layer 140, light-emitting layer 150, electron-transporting layer 155, and electron-injecting layer 160 include a series of organic layers 170 disposed between anode 130 and cathode 190. Organic layers 170 are the layers most desirably deposited by the device and method of this invention, and the components including these layers are the organic materials of the present method. These components will be described in more detail.

Substrate 120 can be an organic solid, an inorganic solid, or a combination of organic and inorganic solids. Substrate 120 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 120 can be a homogeneous mixture of materials, a composite of materials, or multiple layers of materials. Substrate 120 can be an OLED substrate, that is a substrate commonly used for preparing OLED devices, e.g. active-matrix low-temperature polysilicon or amorphous-silicon TFT substrate. The substrate 120 can either be light transmissive or opaque, depending on the intended direction of light emission. The light transmissive property is desirable for viewing the EL emission through the substrate 120. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 120 and is most commonly configured as an anode 130. When EL emission is viewed through the substrate 120, anode 130 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 135 be formed over anode 130 in an organic light-emitting display. The hole-injecting material can serve to improve the film formation property of subsequent organic layers and to facilitate injection of holes into the hole-transporting layer 140. Suitable materials for use in hole-injecting layer 135 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 140 be formed and disposed over anode 130. Desired hole-transporting materials can be deposited by any suitable means such as evaporation, sputtering, chemical vapor deposition, electrochemical means, thermal transfer, or laser thermal transfer from a donor material, and can be deposited by the device and method described herein. Hole-transporting materials useful in hole-transporting layer 140 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or including at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

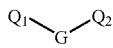

wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

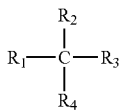

where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

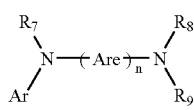

wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to sequentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 150 produces light in response to hole-electron recombination. Light-emitting layer 150 is commonly disposed over hole-transporting layer 140. Desired organic light-emitting materials can be deposited by any suitable means such as evaporation, sputtering, chemical vapor deposition, electrochemical means, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

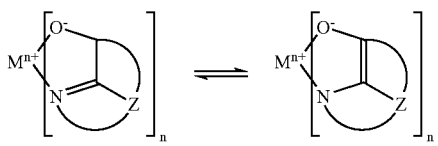

wherein:
M represents a metal;
s n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 150 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 110 includes an electron-transporting layer 155 disposed over light-emitting layer 150. Desired electron-transporting materials can be deposited by any suitable means such as evaporation, sputtering, chemical vapor deposition, electrochemical means, thermal transfer, or laser thermal transfer from a donor material, and can be deposited by the device and method described herein. Preferred electron-transporting materials for use in electron-transporting layer 155 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 160 can also be present between the cathode 190 and the electron-transporting layer 155. Examples of electron-injecting materials include alkaline or alkaline earth metals, alkali halide salts, such as LiF mentioned above, or alkaline or alkaline earth metal doped organic layers.

Cathode 190 is formed over the electron-transporting layer 155 or over light-emitting layer 150 if an electron-transporting layer 155 is not used. When light emission is through the anode 130, the cathode material can include nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material includes a Mg:Ag alloy wherein the percentage of silver is in the range of 1 to 20%, as described in U.S. Pat. No. 4,885,221. Another suitable class of cathode materials includes bilayers having a thin layer of a low work function metal or metal salt capped with a thicker layer of conductive metal. One such cathode includes a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 190, it must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The invention has been described in detail with particular reference to certain preferred embodiments thereof, but it will be understood that variations and modifications can be effected within the spirit and scope of the invention.

| PARTS LIST | |
|---|---|
| 5 | vaporization apparatus |
| 10 | organic material inlet |
| 15 | nozzle |
| 20 | base block |
| 30 | control passage |
| 40 | permeable first member |
| 45 | container |
| 50 | second member |
| 55 | metering valve |
| 60 | manifold |
| 70 | shield |
| 75 | load lock |
| 80 | deposition chamber |
| 85 | OLED substrate |
| 90 | aperture |
| 95 | translational apparatus |
| 100 | vacuum source |
| 110 | OLED device |
| 120 | substrate |
| 130 | anode |
| 135 | hole-injecting layer |
| 140 | hole-transporting layer |
| 150 | light-emitting layer |
| 155 | electron-transporting layer |
| 160 | electron-injecting layer |
| 170 | organic layers |
| 190 | cathode |

The invention claimed is:

1. A method for vaporizing organic materials onto a surface, to form a film comprising:
   (a) providing a quantity of organic material in a fluidized powdered form;
   (b) metering the powdered organic material and directing a stream of such fluidized powder onto a first member;
   (c) heating the first member so that as the metered stream of fluidized powder contacts the first member such fluidized powder is vaporized;
   (d) collecting the vaporized organic material in a manifold;
   (e) providing a second member formed with at least one aperture in communication with the manifold that permits the vaporized organic material to be directed onto the surface to form a film; and
   (f) providing a deposition chamber and interrupting the vaporization and thereby reducing contamination of the deposition chamber walls and conserving the organic materials when a substrate is not being coated.

2. The method according to claim 1 wherein the organic material is provided in a fluidized powdered form by evaporation or rapid expansion of a solution of the organic material in a supercritical solvent.

3. The method according to claim 1, where the fluidized organic material is metered by a valve at a controlled rate that varies linearly with vaporization rate.

4. The method according to claim 1, wherein vapor leaves the aperture and is directed onto the surface.

5. The method according to claim 1, wherein the first member and the second member are heated at a constant temperature as the organic material is consumed.

6. The method according to claim 3, wherein the valve includes a nozzle that is heated.

7. A method for vaporizing organic materials onto a surface, to form a film comprising:
   (a) providing a quantity of organic material in a powdered form into a container;
   (b) fluidizing and metering the powdered organic material and directing a stream of such fluidized powder onto a permeable first member;
   (c) heating the permeable first member so that as the metered stream of fluidized powder contacts the permeable first member such fluidized powder vaporizes and passes through the permeable first member;
   (d) collecting the vaporized organic material in a manifold;
   (e) providing a second member formed with at least one aperture in communication with the manifold that permits the vaporized organic material to be directed onto the surface to form a film; and
   (f) providing a deposition chamber and interrupting the vaporization and thereby reducing contamination of the deposition chamber walls and conserving the organic materials when a substrate is not being coated.

8. The method according to claim 7, where the fluidized organic material is metered by a valve at a controlled rate that varies linearly with vaporization rate.

9. The method according to claim 7, wherein vapor leaves the aperture and is directed onto the surface.

10. The method according to claim 7, wherein the permeable first member and the second member are heated at a constant temperature as the organic material is consumed.

11. The method according to claim 8, wherein the valve includes a nozzle that is heated.

12. A method for vaporizing organic materials onto a surface, to form a film comprising:
   (a) providing a quantity of organic material in a powdered form into a container;
   (b) fluidizing and metering the powdered organic material and directing a stream of such fluidized powder onto a permeable first member;
   (c) heating the permeable first member so that as the metered stream of fluidized powder contacts the permeable first member such fluidized powder vaporizes and passes through the permeable first member;
   (d) collecting the vaporized organic material in a heated manifold;
   (e) providing a second member formed with at least one aperture in communication with the manifold so that the residence time of the vaporized organic material in the manifold is short enough to ensure that there is little or no material degradation and higher vaporization rates are achieved;
   (f) providing a deposition chamber and interrupting the vaporization and thereby reducing contamination of the deposition chamber walls and conserving the organic materials when a substrate is not being coated.

13. The method according to claim 12, where the fluidized organic material is metered by a valve at a controlled rate that varies linearly with vaporization rate.

14. The method according to claim 12, wherein vapor leaves the aperture and is directed onto the surface.

15. The method according to claim 12, wherein the permeable first member and the second member are heated at a constant temperature as the organic material is consumed.

16. The method according to claim 13, wherein the valve includes a nozzle that is heated.

* * * * *

UNITED STATES PATENT AND TRADEMARK OFFICE
CERTIFICATE OF CORRECTION

PATENT NO. : 7,238,389 B2 Page 1 of 1
APPLICATION NO. : 10/805980
DATED : July 3, 2007
INVENTOR(S) : Michael Long et al.

It is certified that error appears in the above-identified patent and that said Letters Patent is hereby corrected as shown below:

Claim 2, Column 13, Line 57    In Claim 2, delete "supereritical" and insert -- supercritical --

Signed and Sealed this

Eleventh Day of March, 2008

JON W. DUDAS
*Director of the United States Patent and Trademark Office*